US005714875A

United States Patent [19]
Lawrence et al.

[11] Patent Number: 5,714,875

[45] Date of Patent: Feb. 3, 1998

[54] ELECTRON BEAM STOP ANALYZER

[75] Inventors: Courtlandt B. Lawrence, Kanata; M. Aslam Lone, Deep River; John W. Barnard, Manitoba; Dennis L. Smyth, Deep River; Wlodzimierz Kaszuba, Gloucester, all of Canada

[73] Assignee: Atomic Energy of Canada Limited, Ontario, Canada

[21] Appl. No.: 392,512

[22] Filed: Feb. 23, 1995

[51] Int. Cl.$^6$ .......... G01R 31/02

[52] U.S. Cl. .......... 324/71.3; 250/396

[58] Field of Search .......... 324/71.3, 71.1; 250/396

[56] References Cited

U.S. PATENT DOCUMENTS

| | | | |
|---|---|---|---|
| 3,733,546 | 5/1973 | Faltens et al. | 324/71.3 |
| 4,233,515 | 11/1980 | Dietrich et al. . | |
| 4,290,012 | 9/1981 | Berte et al. . | |
| 4,296,372 | 10/1981 | Feuerbaum | 324/71.3 |
| 4,336,597 | 6/1982 | Okubo et al. . | |
| 4,629,975 | 12/1986 | Fiorito et al. . | |
| 4,724,324 | 2/1988 | Liebert | 324/71.3 |
| 4,992,742 | 2/1991 | Okuda et al. | 324/71.3 |
| 5,138,256 | 8/1992 | Murphy et al. | 324/71.3 |
| 5,198,676 | 3/1993 | Benvenista et al. . | |

*Primary Examiner*—Maura K. Regan
*Attorney, Agent, or Firm*—Sughrue, Mion, Zinn, Macpeak & Seas, PLLC

[57] ABSTRACT

An electron beam stop for use with high power electron beam accelerators can be used to measure beam parameters including energy, current, scan width, scan offset and scan uniformity. The beam stop is split in two segments in the direction of electron travel, with the first segment closest to the beam source absorbing a portion of the electrons incident thereon and the second segment farthest from the beam source absorbing all of the electrons that pass through the first segment. The ratio of charges deposited in the two segments is a sensitive index of the energy of the primary electrons, i.e., a measure of beam energy. The sum of the charges in the two segments is a direct measure of the number of electrons incident on the absorbing medium, i.e., a measure of the beam current.

12 Claims, 6 Drawing Sheets

FIG.4A
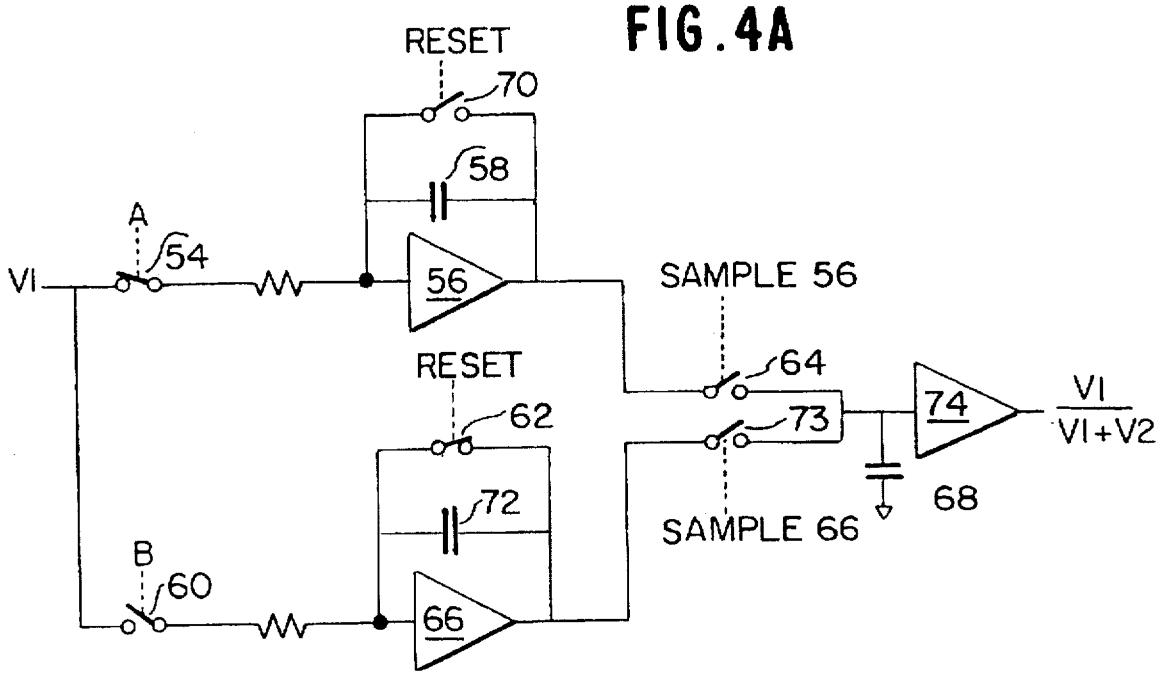
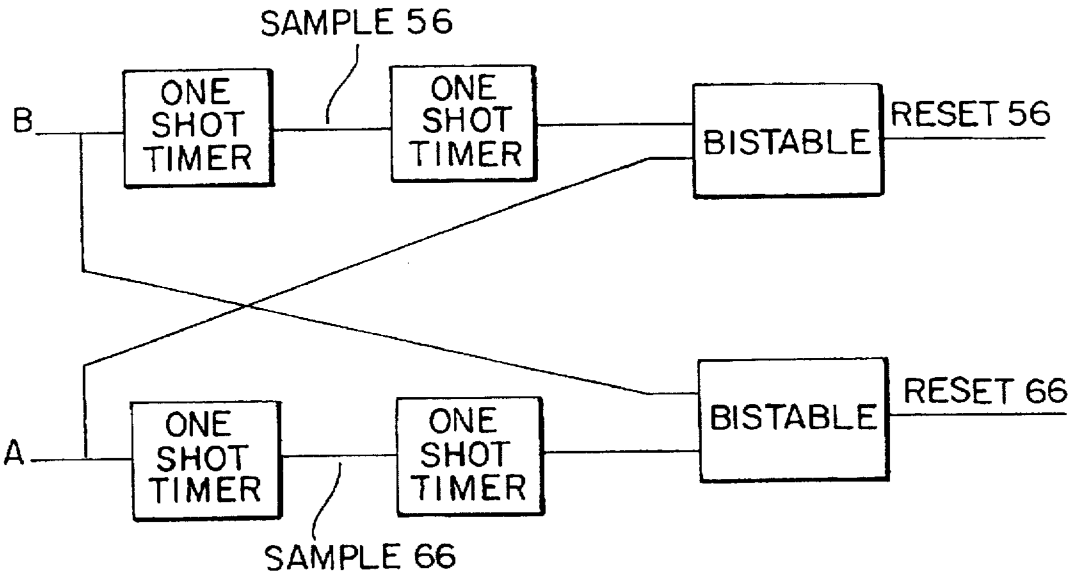
FIG.4B

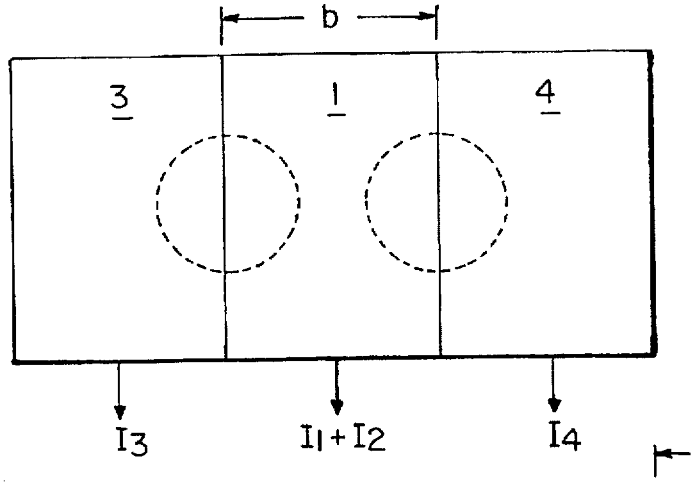
FIG.5A
FIG.5B
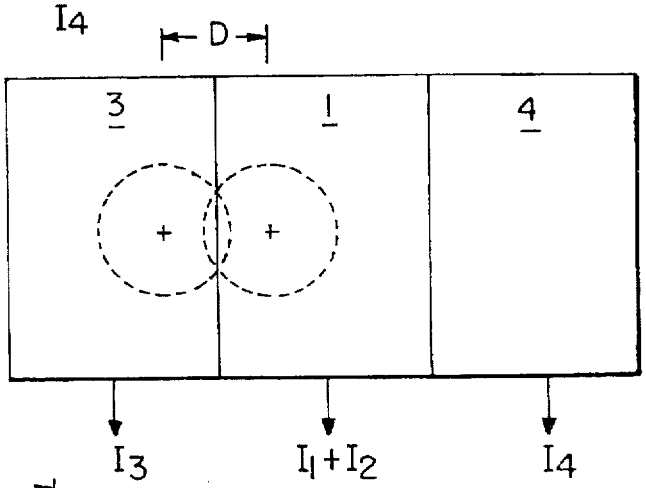
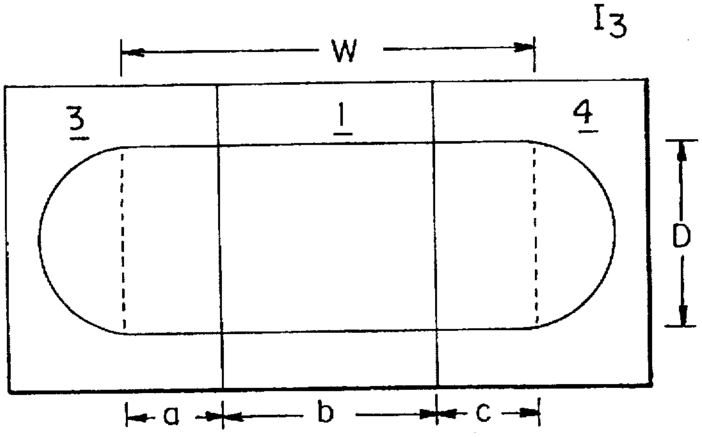
FIG.5C
FIG.5D
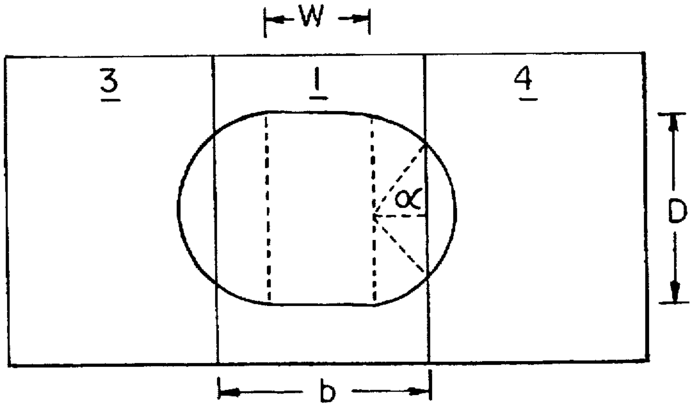

ELECTRON BEAM STOP ANALYZER

TECHNICAL FIELD

This invention relates to an electron beam stop for use with high power electron beam accelerators which can be used to measure beam parameters including energy, current, scan width, scan offset and scan uniformity.

BACKGROUND OF THE INVENTION

Electron beam accelerators are used to irradiate products with a beam of electrons. In some applications, it is necessary that the product receive an exact prescribed radiation dose. The radiation dose that the products receive is proportional to the electron beam current. The depth of penetration of the electrons is proportional to the electron beam energy. It is therefore important that the current and energy of an electron beam be known with a high degree of reliability. More specifically, it is necessary to have frequent independent measurements of electron beam current, energy, scan width, scan offset and scan uniformity in order that such parameters may be accurately controlled. It is also desirable that the beam parameters be measured with minimum disruption to the production schedule for the accelerator.

It is conventional practice to measure the energy of an electron beam by comparing the depth dose penetration curve of the electron beam with known data. The depth that electrons will penetrate into a material is proportional to the electron beam energy and the density of the material. A depth dose curve is obtained by placing radiation sensitive film between two wedges. The wedges are arranged with the thin edge of one wedge above the thick edge of the other wedge, with the film disposed between the two wedges. The wedge-film assembly is then exposed to the electron beam for a suitable length of time. After exposure to the electron beam, the film acquires an optical density proportional to the radiation dose that it received. Beyond the depth which electrons can penetrate the aluminum, the dose received by the film is near zero. From the depth-dose curve, obtained with an optical densitometer, the energy of the electron beam can be determined.

It is conventional practice to measure the current of an electron beam with a water-filled metal container that is open to the electron beam and deep enough to stop all electrons from the electron beam. The water filled container is placed on an insulator under the accelerator's scan horn and is connected to a ground potential through a resistor of known value. The resistor is also connected to a calibrated oscilloscope or integrating digital voltmeter located outside the accelerator's concrete shield. For an accelerator that is pulsed, the voltage across the resistor is read from the oscilloscope and the peak current is calculated. The average current is determined by measuring the voltage across the resistor with an integrating voltmeter and then determining the current from the relationship:

$$I = \frac{V}{R} \quad (1)$$

It is conventional practice to measure the scan width, scan offset and scan uniformity of an electron beam by moving a strip of radiation sensitive film through the radiation beam. The film is darkened by the electron beam in proportion to the dose of electrons received. An optical densitometer is used to measure the optical density along the strip and the optical density is converted to radiation dose by using calibration data from known exposure to radiation. The scan width, scan offset and dose uniformity are then determined by examining the data and performing certain calculations.

A major drawback with the measuring methods currently used is that production of irradiated products must be stopped in order that the measuring apparatus can be brought inside the accelerator's shielding vault and the necessary measurements taken. The delay and inconvenience of the process is exacerbated by the requirement that measurements need to be taken frequently. When using the current methods additional time must also be spent to process the film and to take the optical density readings from the optical densitometer. As a result, production time is lost and the measurement results are not immediately available.

DISCLOSURE OF THE INVENTION

High power electron accelerators require a beam stop at the output of the accelerator to stop the electron beam and absorb the power that it deposits. The beam stop for a high power accelerator is usually water cooled to take away the absorbed power. In accordance with the present invention, the beam stop is designed so as to provide a direct measure of the beam parameters including beam current, beam energy, scan width scan offset and scan uniformity.

The present invention is based on the principal that electrons of a given energy have a statistical range of penetration into an absorbing medium. The present invention uses a beam stop that is split in two segments in the direction of electron travel, with the first segment closest to the beam source absorbing a portion of the electrons incident thereon and the second segment farthest from the beam source absorbing all of the electrons that pass through the first segment. The ratio of charges deposited in the two segments is a sensitive index of the energy of the primary electrons, i.e., a measure of beam energy. The sum of the charges in the two segments is a direct measure of the number of electrons incident on the absorbing medium, i.e., a measure of the beam current.

Thus in accordance with the present invention, there is provided a device for determining beam parameters of a beam of electrons comprising:

a first beam absorbing segment disposed in the path of said beam and effective to absorb a portion of the electrons incident thereon and to permit the remaining portion of the electrons to pass therethrough;

a second beam absorbing segment disposed behind said first absorbing section and effective to absorb the portion of the electrons that passes through said first absorbing segment;

means for sensing the amount of electrical charge deposited by said beam in each of said first and second beam absorbing segments and developing electrical signals proportional thereto;

processing means for converting said electrical signals into a measure of beam energy based on the relative amount of charge deposited in the first and second absorbing segments.

In accordance with another aspect of the invention, there is provided a method for determining beam parameters of a beam of electrons comprising:

providing a first beam absorbing segment in the path of said beam effective to absorb a portion of the electrons incident thereon and to permit a portion of the electrons to pass therethrough;

providing a second beam absorbing segment behind said first absorbing section effective to absorb the portion of the electrons that passes through said first absorbing segment;

sensing the amount of electrical charge deposited by said beam in each of said first and second beam absorbing segments and developing electrical signals proportional thereto;

converting said electrical signals into a measure of beam energy based on the relative amount of charge deposited in the first and second absorbing segments.

BRIEF DESCRIPTION OF THE DRAWINGS

These and other features of the present invention are more fully set forth below in the accompanying detailed description, presented solely for purposes of exemplification and not by way of limitation, and in the accompanying drawings, of which:

FIG. 4A is a schematic representation of the beam energy integrator;

FIG. 4B is a schematic representation of the sample and reset control for the beam energy integrator;

FIG. 5A is a plan view of the beam stop segments as used for calibration of the scan magnet current;

FIG. 5B is a plan view of the beam stop segments as used for measurement of the spot diameter;

FIG. 5C is a plan view of the beam stop segments as used for scan width measurement;

FIG. 5D is a plan view of the beam stop segments as used for scan width measurement where w is less than b.

DETAILED DESCRIPTION OF THE INVENTION

Figure 1A:
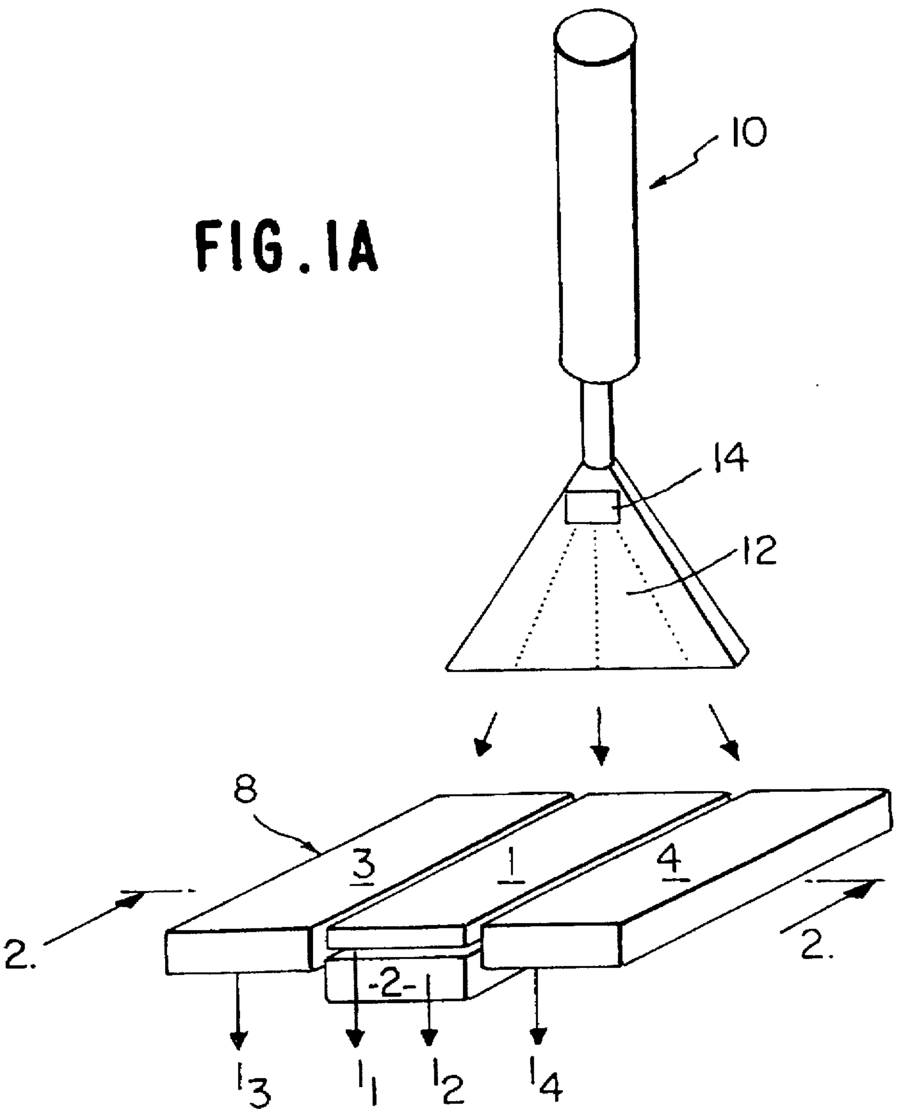
FIG. 1A is a perspective view of an electron beam accelerator and the beam stop analyzer of the present invention.
Figure 1B:
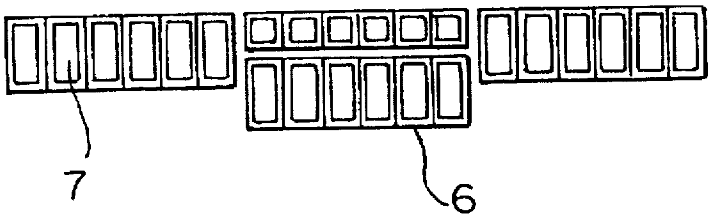
FIG. 1B is a cross-sectional view of the beam stop taken along line 2—2 of FIG. 1.

The invention comprises an electron beam stop as is generally indicated by the numeral 8 in FIG. 1A. The beam stop 8 is used in association with accelerator 10 which generates an electron beam that is scanned through scan horn 12 by scan magnet 14 in a manner known in the art. Beam stop 8 comprises four absorbing segments 1, 2, 3 and 4. As shown in FIG. 1B each absorbing segment consists of a series of rectangular aluminum tubes 6 joined longitudinally. The ends of the rectangular aluminum tubes are closed off and the tubes of each segment are interconnected to form a series-connected channel 7. Cooling water is pumped through channel 7 of each segment. The water cooled segments prevent the overheating of the aluminum tubes and the concrete below the beam stop which is the material most commonly used to construct the accelerator's shielding vault. The segments of beam stop 8 thus far described are conventional for use with high energy (10 MeV or higher) electron beam accelerators. In accordance with the present invention, beam stop 8 is positioned in a plane perpendicular to the axis of accelerator 10 with segment 1 located on the axis of accelerator 10 and is disposed centrally between segments 3 and 4. Segment 2 is disposed directly behind segment 1 in the direction of electron travel. Segments 1 to 4 are electrically separated from each other, for example by a small air gap with ceramic spacers or other means to maintain the segments electrically independent. Cooling water connections at the ends of each segment are insulated from other segments and the cooling water supply by means of ceramic pipe sections (not shown). The cooling water is deionized with the use of ion exchange columns (not shown) to reduce the electrical conductivity of the water. The use of insulators and low conductivity water allows the beam current to be collected and analyzed without undue losses.

The present invention is effective not only to stop the electron beam and absorb the power that it deposits, it permits measurement of electron beam energy, current, and scan width, scan offset and scan uniformity.

Measurement of electron beam energy in accordance with the present invention is based on the principle that a fast moving electron loses all its kinetic energy and deposits its charge at its final resting place. The statistical nature of the interaction process results in finite distribution of the charge deposition along the depth of the absorbing medium. The electron beam energy is measured by splitting beam stop 8 into two parts in the direction of electron travel. The thickness of the segment 1 is selected to stop a fraction of the range of the incident beam. Segment 2 is thick enough to fully stop all incident electrons. The ratio of the charges deposited in the sections is a sensitive index of the energy of the primary electrons, i.e. a measure of the beam energy. The thickness of segment 1 is selected such that a known fraction of the electrons are stopped at the nominal operating beam energy. Segments 2, 3, and 4 are all the same thickness and are sized to stop all electrons at the nominal operating energy. When used in conjunction with an accelerator having a nominal operating beam energy of 10 MeV, the following construction parameters have been found suitable for the present invention. Segments 1, 2, 3 and 4 are each constructed of rectangular aluminum tubes 1.5 meters long. Segment 1 is 1 inch thick in the direction of electron travel, with walls that are ⅛ inch thick and an interior cooling water channel that is ¾ inch thick. Segments 2, 3, and 4 are each 3 inches thick in the direction of electron travel, with walls that are 3/16 inch thick and an interior cooling water channel of 2⅝ inches.

Segment 1 is effective to stop about 70% of the incident electrons. This has been found to be a reasonable trade-off between sensitivity and dynamic range. Where segment 1 stops significantly less of the electrons, the sensitivity of the measurement is reduces because the change in the charge collected on segment 2 as the energy varies is smaller. If a significantly larger fraction of the electrons is stopped in segment 1, for example 90%, then as the energy of the electron beam falls below about 9 MeV, substantially no electrons will penetrate segment 1 and a measurement is not possible. When segment 1 is configured to stop about 70% of the electrons, measurement from about 7 MeV and up with reasonable sensitivity is achieved.

The electron beam energy is determined by electronically processing the time varying current signals from segments 1 and 2. The electron beam current produced by accelerator 10 is determined by directly measuring the sum of the charges on segment 1 and segment 2 of the beam stop. The measurement is taken by insulating the water cooled electron beam stop from ground potential and connecting the insulated beam stop to ground potential through a resistor. The voltage is then observed on the oscilloscope and the electron beam current calculated from equation (1). Because the electron beam is usually scanned in a direction that is perpendicular to the motion of the product a time varying current signal from the beam stop segments is produced.

Electron beam accelerators produce a current that is continuous or pulsed. If the accelerator produces pulses of beam current, the average current is determined by the pulse duration, the pulse frequency and the current during the pulse. To measure beam current and beam energy independently, the measurement should be carried out without using the timing circuit that is used to generate the accelerator pulse or else a failure in the timing circuit could give a correlated false measurement. The integration of current is also used for the energy measurement because it is a good mimic of the way product accumulates dose.

The desired beam energy measurement (E) is described by the following equation:

$$E = \frac{C_1 \int_{t_0}^{t_1} I_2(t)dt}{\int_{t_0}^{t_1} I_1(t) + I_2(t)dt} + C_3 \tag{2}$$

where $C_1$ and $C_3$ are calibration factors that relate this measurement of energy to the energy determination by the depth dose method (using an aluminum wedge and film) conventionally used. The conventional aluminum wedge and film method will provide a measured electron beam energy of say X1 MeV. The electronic circuit that solves Equation (2) will give an output of say Y1 volts for the same electron beam. A second measurement with an electron beam of a different energy using the wedge and film method will give a second energy of X2 MeV and the electronic circuit will give an output of Y2 MeV. From these two calibration points, the calibration factors $C_1$ and $C_3$ are calculated. $C_1$ is the sensitivity of the electronic measurement, i.e., MeV/volts, and $C_3$ is the threshold factor. $C_3$ is determined by the thickness of segment 1 and represents the threshold energy of electrons that will just penetrate segment 1. For the dimensions and materials described above for segment 1, $C_3$ is equal to about 7.5 MeV. Equation (2) is solved by electronically integrating the variables in the denominator for a time interval $t_0$ to $t_1$ that will yield a known constant, $C_2$, i.e., a time interval $t_0$ to $t_1$ is calculated such that;

$$C_2 = \int_{t_0}^{t_1} I_1(t) + I_2(t)dt \tag{3}$$

The variable in the numerator is simultaneously integrated for exactly the same time interval. The energy, E, is then electronically calculated by the following equation:

$$E = \frac{C_1}{C_2} \int_{t_0}^{t_1} I_2(t)dt + C_3 \tag{4}$$

The measurement of integrated current is used for the energy measurement for the following reason. Electron beam accelerators, depending on the technology used to accelerate the beam, can produce a current that is continuous, i.e., dc current, or pulsed. If the accelerator produces pulses of beam current, the average current is determined by the pulse duration, the pulse frequency and the current during the pulse. To make an independent measurement of beam current and energy, the measurement should be carried out without using the timing circuit that is used to generate the accelerator pulse or else a failure of the timing circuit could give a correlated false measurement. Moreover, the integration of current is a good mimic of the way product accumulates dose. It is important that the integration of the numerator and denominator of equation (2) occur for a coincident time period. The electron beam from the accelerator is scanned across the beam stop and for a pulsed accelerator many of the pulses will impinge on two segments at the same time.

Figure 2A:
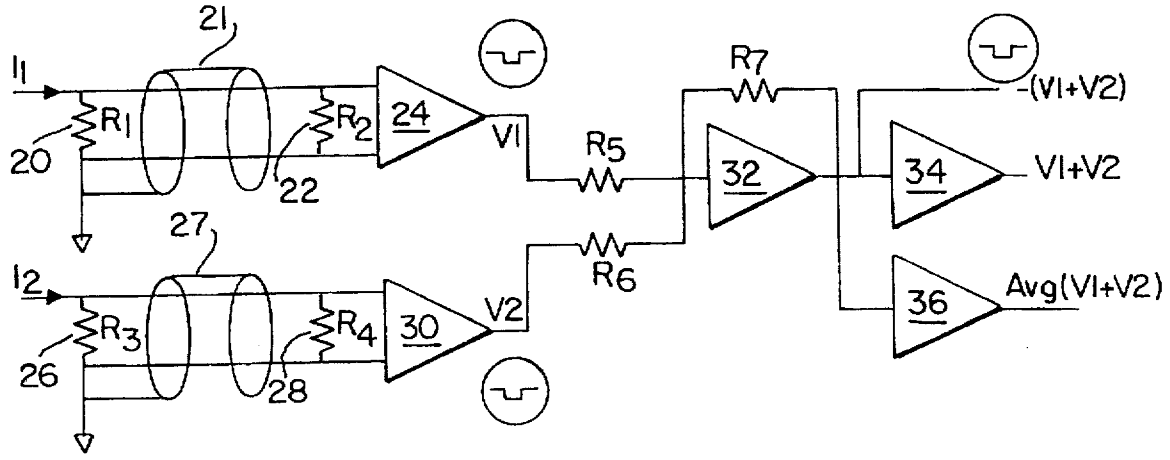
FIG. 2A is a schematic representation of a circuit to develop voltages proportional to the charges deposited in segments 1 and 2 of the beam stop.

A circuit to develop voltages proportional to the charges deposited in segments 1 and 2 of beam stop 8 is shown in FIG. 2A. Current $I_1$ from beam stop segment 1 flows through resistors 20 and 22 and shielded twisted pair cable 21 to generate a voltage V1 at the output of buffer amplifier 24. Similarly current $I_2$ from the lower segment 2 flows through resistors 26 and 28 and shielded twisted pair cable 27 to generate a voltage V2 at the output of buffer amplifier 30. V1 and V2 are summed by operational amplifier circuit 32 to produce −(V1+V2) and then inverted by amplifier 34 to produce (V1+V2). Amplifier 36 is a second order low pass filter that filters the ripple from each accelerator pulse and provides the average of (V1+V2) that is proportional to the current from segments 1 and 2. The signals −(V1+V2) and (V1+V2) are used in the time base circuit shown in FIG. 3A.

Figure 2B:
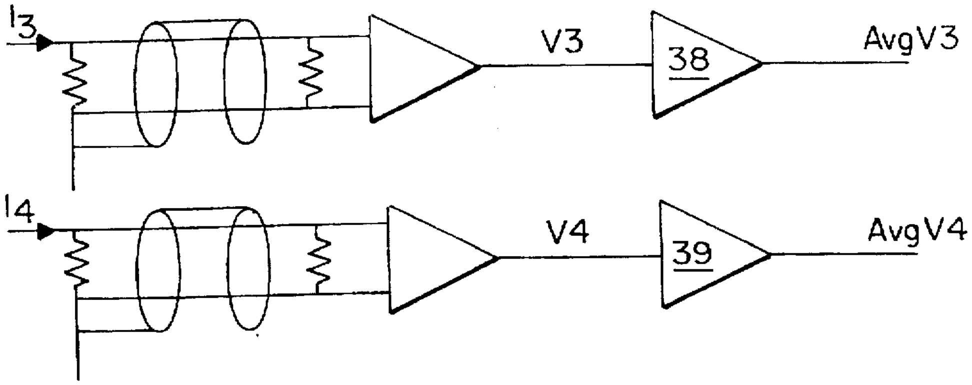
FIG. 2B is a schematic representation of a circuit to develop voltages proportional to the charges deposited in segments 3 and 4 of the beam stop.

A circuit to develop voltages proportional to the charges deposited in segments 3 and 4 of beam stop 8 is shown in FIG. 2B. The operation of the circuit is similar to that of FIG. 2A. Amplifiers 38 and 39 are second order low pass filters and provide the average of V3 and V4 that are proportional to the average of the current from segments 3 and 4 respectively.

Figure 2C:
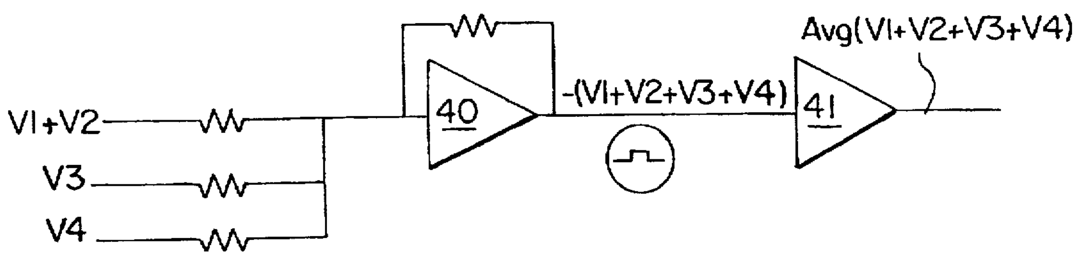
FIG. 2C is a schematic representation of a circuit to develop a voltage proportional to the charges deposited in segments 1, 2, 3 and 4 of the beam stop.

A circuit to develop voltages proportional to the sum of the charges deposited in segments 1, 2, 3 and 4 of beam stop 8 is shown in FIG. 2C. Voltages (V1+V2), V3 and V4 derived from the circuits of FIGS. 2A and 2B are summed in operational amplifier 40 and passed through second order low pass filter 41 to provide the average of (V1+V2+V3+V4).

Figure 3A:
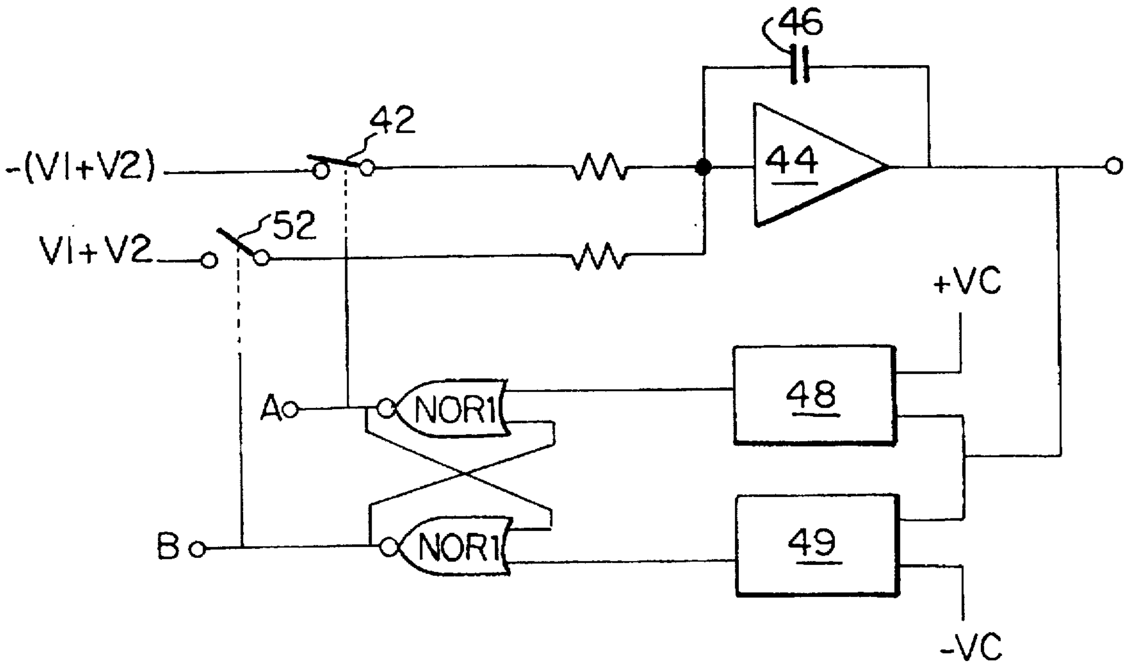
FIG. 3A is a schematic representation of the time base circuit.
Figure 3B:
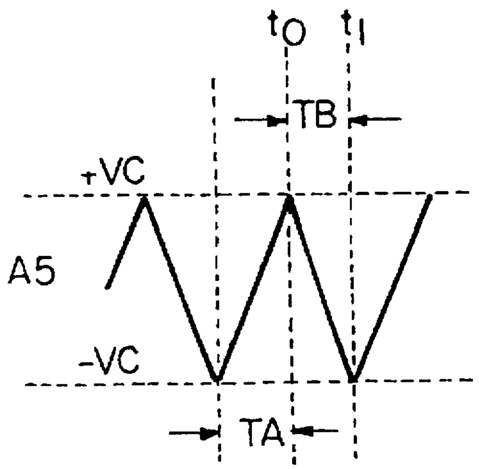
FIG. 3B is a graphical representation of the time base signal generated by the time base circuit.

The time base circuit of FIG. 3A calculates the time $t_0$ to $t_1$ that yields the integral of V1+V2 to be 2VC. With switch 42 closed, the signal −(V1+V2) is integrated by operational amplifier circuit 44. The charge accumulates (integrates) on capacitor 46 until a voltage VC is reached. This causes the output of comparator 48 to provide a logic true signal at its output. This causes the logic state of the bistable NORcircuit 50 to change which opens switch 42 and closes switch 52. The signal V1+V2 is applied to integrator circuit 44 which causes charge to be removed from capacitor 46. Thus, if the input signals V1 and V2 are a constant voltage, the output signal from amplifier 44 is a continuous triangular waveform such as that shown in FIG. 3B. If V1 and V2 are a stream of pulses, the output waveform of amplifier 44 is also triangular, but with a fine structure that is similar to stair steps. In either case the peak to peak amplitude of the triangular waveform is a constant amplitude, 2VC, and the time that each of the logic signals A and B is true ($t_1-t_0$) is proportional to V1+V2.

VC is a positive voltage applied to comparator 48. The inverted voltage −VC is applied to comparator 49. The voltage VC is selected to permit amplifier 44 to integrate over a dynamic range that is as wide as possible. If amplifier 44 is designed to operate with ±15V power supplies, then typically good performance is achieved for a dynamic range of ±10V. For this situation, VC is selected to be +10V and then inverted to provide −VC of −10V. Thus, the triangular waveform shown in FIG. 2B will have a peak to peak amplitude of 2VC or 20 volts. For such a design, as defined by Equation 3, $C_2$=2 CV=20 volts.

FIG. 4A shows a circuit that solves equation (4) to give the energy of the electron beam using the time interval $t_0$ to $t_1$ from the time base circuit of FIG. 3A. With the logic signal A from bistable NOR circuit 50 true, switch 54 is closed and applies V1 to operational amplifier 56 which causes charge to be removed from capacitor 58. Charge removal is proportional to V1 and continues as long as the logic signal A from bistable NOR circuit 50 is true, the time interval $t_0$ to $t_1$. When logic signal A becomes false and logic signal B from bistable NOR circuit 50 becomes true, switch 54 opens, switch 60 closes, switch 62 opens and switch 64 closes. This holds the voltage on capacitor 58, takes operational amplifier 66 out of the reset mode, allows operational amplifier 66 to integrate the V1 signal and transfers the voltage held on capacitor 58 to capacitor 68. After a delay to allow capacitor 68 to fully charge, switch 64 is opened. After a second delay, switch 70 is closed which resets operational amplifier 56 to 0 volts. Thus the voltage integrated by operational amplifier 56 is held on capacitor 68 while operational amplifier 66 integrates V1 and operational amplifier 56 is reset. When output A becomes true and output B false once again, the voltage integrated by capacitor 72 is transferred to capacitor 68 through switch 73 in the same manner. Thus the output of amplifier 74 is the integral of V1 over a time period $t_0$ to $t_1$. Since the time base circuit of FIG. 3A integrates V1+V2 until a constant, 2VC, is reached, the output of amplifier 74 is proportional to the integral of $I_1$, divided by the integral of $I_1+I_2$.

FIG. 4B shows the sample and reset control for the energy integrator circuit of FIG. 4A. The circuit generates pulses, SAMPLE56 and SAMPLE66 for sampling the output of operational integrating amplifiers 56 and 66 respectively, and reset pulses RESET56 and RESET66 respectively, for resetting to zero operational integrating amplifiers 56 and 66 respectively.

The outputs of the circuits shown in FIGS. 2A, 2B and 2C permit beam parameters measurement. The average of signals $I_1+I_2$, $I_3$ and $I_4$ are used to calculate the scanned beam parameters. The average of $I_1+I_2+I_3+I_4$ is used for the graphical display of scan-magnet current versus beam stop current.

The electron beam scan width and scan offset measurements can be determined by a set of procedures and calculations based on the average current measured from segments. The equations for the measurements are given below. The equations have been derived by assuming that the beam spot has a uniform current density. The beam spot from an accelerator does not have a uniform current density and often shows a gaussian distribution. However, the assumption of uniform density is useful and valid when the product that is irradiated moves through the scanned beam. The movement through the beam integrates the beam current in the direction of motion and the current distribution is inconsequential. When the current is collected on beam stop segments that are longer than the beam spot diameter, the current is similarly integrated in the direction of motion.

To measure the scan width, the beam's spot diameter must be determined first. For this measurement, the current from beam stop segments 1 and 2 are added together electronically to produce the same current as though the two segments were physically connected. Before the diameter can be measured, the calibration constant of the drive magnet must be calculated. To perform the measurement, the accelerator is operated at a low Pulse Repetition Frequency (PRF) and the scanner stopped. A dc current is applied to scan magnet 14 to centre the beam on the boundary between segments 1 and 3 as shown in FIG. 5A. The beam is centered on the boundary when $I_3$ is equal to $I_1+I_2$. The current through the scan magnet when the beam is centered is then recorded as $I_a$. The measurement is repeated with the beam centered on the boundary between segments 1 and 4 to give a second current through the scan magnet, $I_b$. The calibration constant of the magnet, K, is given by the following equation:

$$K=\frac{b}{I_a-I_b} \quad (5)$$

where b is the width of segment 1.

The spot diameter is defined as the diameter that will provide 95% of the total current in the spot. This measurement is illustrated in FIG. 5B. The accelerator is operated at a low PRF with the scanner stopped. The dc current is adjusted through scan magnet 14 to give:

$$I_3=0.95\,(I_1+I_2+I_3) \quad (6)$$

and the scan magnet current is recorded as $I_c$. The dc magnet current is then adjusted to give:

$$I_1+I_2=0.95\,(I_1+I_2+I_3) \quad (7)$$

and the scan magnet current is recorded as $I_d$. The beam spot diameter can then be calculated from:

$$D=K\,(I_c-I_d) \quad (8)$$

The scan width measurement is shown in FIG. 5C. The total current, I, is given by:

$$I=I_1+I_2+I_3+I_4 \quad (9)$$

The current flow from each segment is proportional to the area of the beam on the segment divided by the total area of the beam on the beam stop. The total area of the beam, A, is given by:

$$A=\frac{\pi D^2}{8}+aD+bD+cd+\frac{\pi D^2}{8} \quad (10)$$

and as defined in FIG. 5C:

$$w=a+b+c \quad (11)$$

therefore:

$$A=wD+\frac{\pi D^2}{4} \quad (12)$$

The current from the segments are given by the following equations:

$$I_3=\frac{I}{A}\left(aD+\frac{\pi D^2}{8}\right) \quad (13)$$

$$I_1+I_2=\frac{I}{A}\ \frac{bD}{A} \quad (14)$$

$$I_4=\frac{I}{A}\left(cD+\frac{\pi D^2}{8}\right) \quad (15)$$

Equation (12) and (14), solved for w gives $$w=b\left(\frac{I}{I_1+I_2}\right)-\frac{\pi D}{4} \quad (16)$$

where D is the beam spot diameter and b is the width of the beam stop's centre segment.

FIG. 5D illustrates the case where the scan width is less than the width of the centre beam stop segment. For the case where w≦b–D:

$$I_1+I_2=I \quad (17)$$

For the case where b–D≦w≦b, the current in the centre segment is given by the following:

$$I_1+I_2=I\left(1-\frac{\text{beam area outside segment } S_1}{\text{beam area}}\right) \quad (18)$$

Solving the geometry shown in FIG. 5D gives the following:

$$I_1+I_2=I\left[1-\frac{\alpha D-(b-w)\sin\alpha}{2w+\frac{\pi D}{2}}\right] \quad (19)$$

where:

$$\alpha=\cos^{-1}\frac{(b-w)}{D}\text{ radians} \quad (20)$$

Figure 6:
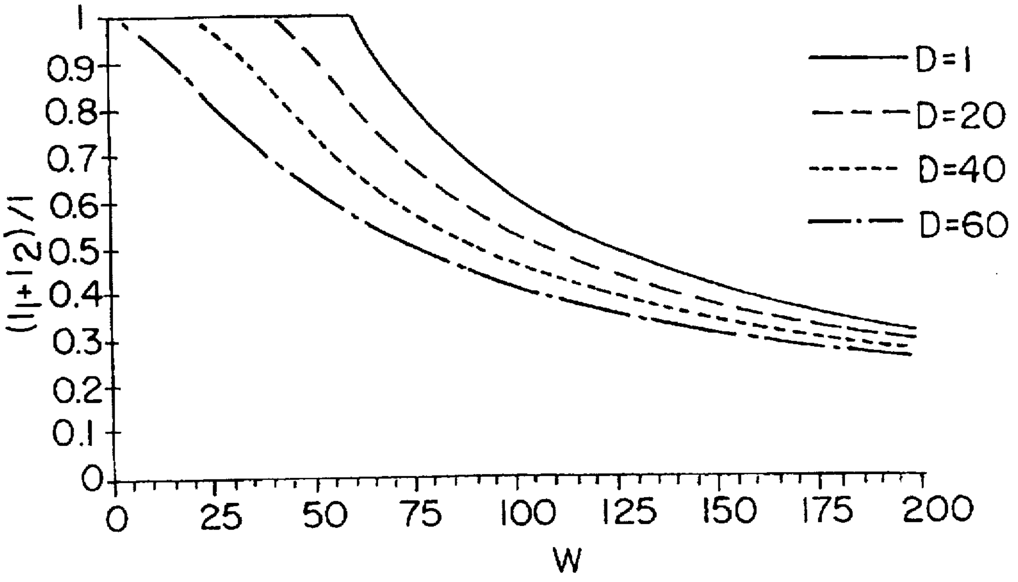
FIG. 6 is a graphical representation of the normalized centre segment current versus the scan width for four beam spot diameters.

FIG. 6 is a graphical representation of the results of Equations 14 and 19 as a function of scan width with the centre segment width (b) set to 60.96 cm (24 inches) and spot diameter set to 1, 20, 40, and 60 cm. The same variables as shown in FIG. 6 can be plotted for any accelerator and the spot diameter estimated by fitting a curve given by equation (2) to the data from the accelerator. The scan width can then be obtained from the centre beam stop segment current.

Another parameter of the scanned beam which can be measured by the present invention is the offset from the centre line of the beam stop. The offset, a–c, can be calculated for equations (11), (12) and (14) to give $$a-c=\frac{I_3-I_4}{I_1+I_2}b \quad (21)$$

The beam parameters derived from the beam stop will only be valid when there is no product being processed between the accelerator output and the beam stop. This occurs because product will absorb some or all of the incident electron beam and therefore only a residual of the electron beam is incident on the beam stop. However, the present invention can be used to provide a scan uniformity graphical display during processing to provide an indication of the current being absorbed by the product and assurance that product is moving through the beam. The scan uniformity can be obtained by displaying, in graphical form, the instantaneous electron beam current collected by the beam stop versus scan magnet current.

Figure 7:
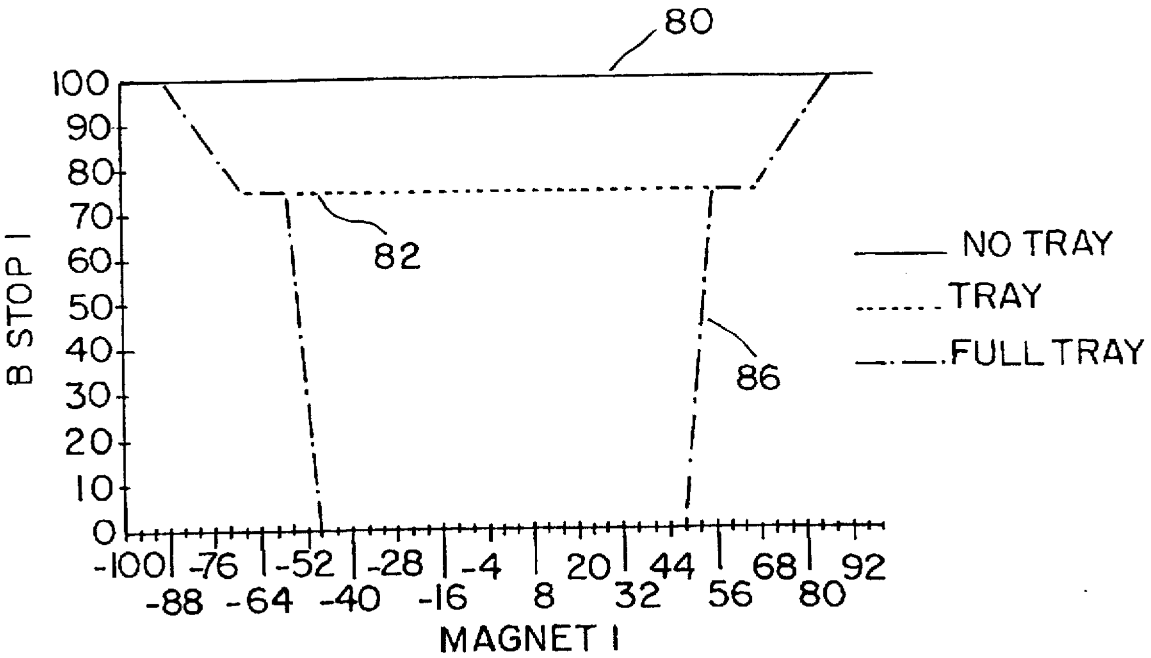
FIG. 7 is a graphical representation of instantaneous beam current against scan magnet current during processing.

A plot showing a typical set of curves of instantaneous current versus scan magnet current is shown in FIG. 7. The top curve indicated by the numeral 80 represents no tray or product between the accelerator and beam stop. The current collected by the beam stop is constant for all values of scan magnet current. The middle curve indicated by the numeral 82 is typical for an empty tray passing through the beam. The tray is about 25% stopping of the beam current and therefore the collected current is about 75% of nominal. When the scan magnet deflects the beam past the edges of the tray, the current increases to 100%. The bottom curve indicated by the numeral 86 is typical for a tray loaded with product where the product plus the tray are fully stopping. The product is narrower than the tray and therefore three values of current are collected by the beam stop: full current when the deflection is past the edge of the tray, 75% when the beam hits the tray but not product, and no current when the beam hits the product.

The measurements that can be made with the method and apparatus of the present invention present a minimum disruption in the production schedule for the accelerator. The invention can also be used to maintain long term reliable calibration of the accelerator. While the invention has been described in association with an electron beam accelerator, those skilled in the art will understand that the invention is applicable to other charged particle beam applications. Moreover, while certain equations and circuits to implement said equations have been described, those skilled in the art will understand that other data and signal processing means can be used.

We claim:

1. A device for determining beam parameters of a beam of electrons comprising:

a first electrically conductive beam absorbing segment disposed in the path of said beam and effective to absorb a portion of the electrons incident thereon and to permit the remaining portion of the electrons to pass therethrough;

a second electrically conductive beam absorbing segment disposed behind and electrically isolated from said first absorbing section and effective to absorb the portion of the electrons that passes through said first absorbing segment;

means for sensing the amount of electrical charge deposited by said beam in each of said first and second beam absorbing segments and developing electrical signals proportional thereto;

processing means for converting said electrical signals into a measure of beam energy on the relative amount of charge deposited in the first and second absorbing segments.

2. The device of claim 1 wherein the first and second beam absorbing segments comprise an electrically conductive structure having internal channels for connection to a source of cooling water.

3. The device of claim 2 wherein the cooling water is deionized and the connection to the source of cooling water is electrically non-conductive.

4. The device of claim 2 wherein the first segment is effective to absorb about 70% of the charged particles incident thereon.

5. The device of claim 1 wherein the processing means converts the current signals from the first and second absorbing segments into a value E in accordance with the following equation:

$$E=\frac{C_1\int_{t_0}^{t_1} I_2(t)dt}{\int_{t_0}^{t_1} I_1(t)+I_2(t)dt}+C_3$$

where $C_1$ and $C_3$ are calibration factors, $I_1$ is the current from the first absorbing segment, $I_2$ is the current from the second absorbing segment, and $t_0$ to $t_1$ is the time interval that yields the denominator equal to known constant $C_2$.

6. The device of claim 1 further comprising third and fourth electrically conductive beam absorbing segments disposed on either side of and electrically isolated from said first absorbing segment and effective to absorb all electrons incident thereon, means for sensing the amount of electrical charge deposited by said beam in each of said third and fourth beam absorbing segments and developing electrical signals proportional thereto and wherein said processing means is further effective to convert said electrical signals into a measure of beam current incident on said first absorbing segment based on the amount of charge deposited in the first and second absorbing segments, and on each of said third and fourth absorbing segments based on the amount of charge deposited in said third and fourth absorbing segments respectively.

7. A method for determining beam parameters of a beam of electrons comprising:

providing a first electrically conductive beam absorbing segment in the path of said beam effective to absorb a portion of the electrons incident thereon and to permit a portion of the electrons to pass therethrough;

providing a second electrically conductive beam segment behind and electrically isolated from said first absorbing section effective to absorb the portion of the electrons that passes through said first absorbing segment;

sensing the amount of electrical charge deposited by said beam in each of said first and second beam absorbing segments and developing electrical signals proportional thereto;

converting said electrical signals into a measure of beam energy based on the relative amount of charge deposited in the first and second absorbing segments.

8. The method of claim 7 wherein the beam absorbing segments each comprise an electrically conductive structure having internal channels and including the step of cooling said segments by passing cooling water through said channels.

9. The method of claim 8 including the step of deionizing the cooling water and electrically insulating the source of cooling water from the segments.

10. The method of claim 7 wherein the first segment is effective to absorb about 70% of the electrons incident thereon.

11. The method of claim 7 wherein the step of converting the current signals from the first and second absorbing segments into a value E is carried out in accordance with the following equation:

$$E = \frac{C_1 \int_{t_0}^{t_1} I_2(t)dt}{\int_{t_0}^{t_1} I_1(t) + I_2(t)dt} + C_3$$

where $C_1$ and $C_3$ are calibration factors, $I_1$ is the current from the first absorbing segment, $I_2$ is the current from the second absorbing segment, and $t_0$ to $t_1$ is the time that yields the denominator equal to known constant $C_2$.

12. The method of claim 7 further comprising providing third and fourth electrically conductive beam absorbing segments on either side of and electrically isolated from said absorbing segment effective to absorb all electrons incident thereon, sensing the amount of electrical charge deposited by said beam in each of said third and fourth beam absorbing segments and developing electrical signals proportional thereto and including the step of converting said electrical signals into a measure of beam current incident on said first absorbing segment based on the amount of charge deposited in the first and second absorbing segments, and on each of said third and fourth absorbing segments based on the amount of charge deposited in said third and fourth absorbing segments respectively.

* * * * *

UNITED STATES PATENT AND TRADEMARK OFFICE

CERTIFICATE OF CORRECTION

PATENT NO. : 5,714,875

DATED : February 3, 1998

INVENTOR(S) : Courtlandt B. LAWRENCE, M. Aslam LONE, John W. BARNARD, Dennis L. SMYTH and Wlodzimierz KASZUBA It is certified that error appears in the above-indentified patent and that said Letters Patent is hereby corrected as shown below:

Column 10, line 31, insert --electrically-- before "sensing".

Column 11, line 24, insert --electrically-- before "sensing".

Signed and Sealed this

Second Day of November, 1999

*Attest:*

Q. TODD DICKINSON

*Attesting Officer*

*Acting Commissioner of Patents and Trademarks*